US012771294B2

(12) United States Patent
Paul et al.

(10) Patent No.: US 12,771,294 B2
(45) Date of Patent: Oct. 20, 2026

(54) BIAS CONTROL CIRCUIT FOR CRYSTAL OSCILLATOR

(71) Applicant: STMicroelectronics International N.V., Geneva (CH)

(72) Inventors: Rik Paul, Kolkata (IN); Pravesh Kumar Saini, Greater Nodia (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 19/174,436

(22) Filed: Apr. 9, 2025

(65) Prior Publication Data

US 2026/0322324 A1 Oct. 15, 2026

(51) Int. Cl.
*H03B 5/04* (2006.01)
*H03B 5/32* (2006.01)

(52) U.S. Cl.
CPC ................. *H03B 5/04* (2013.01); *H03B 5/32* (2013.01)

(58) Field of Classification Search
CPC .................................... H03B 5/04; H03B 5/32
USPC ........................................................... 331/158
See application file for complete search history.

(56) References Cited

U.S. PATENT DOCUMENTS

| | | | | |
|---|---|---|---|---|
| 10,491,157 | B1 * | 11/2019 | Pereira | H03B 5/366 |
| 10,840,926 | B2 * | 11/2020 | Wang | H03L 7/24 |
| 2008/0143452 | A1 | 6/2008 | Rosik et al. | |
| 2012/0326794 | A1 | 12/2012 | Kammula | |
| 2014/0210565 | A1 | 7/2014 | Vilas Boas | |
| 2018/0006605 | A1 | 1/2018 | Kumar | |
| 2018/0364752 | A1 | 12/2018 | Li | |
| 2021/0058080 | A1 | 2/2021 | Kim et al. | |
| 2024/0267000 | A1 | 8/2024 | Garvik | |

FOREIGN PATENT DOCUMENTS

KR 101509421 B1 4/2015

* cited by examiner

*Primary Examiner* — Richard Tan
(74) *Attorney, Agent, or Firm* — Slater Matsil, LLP

(57) ABSTRACT

According to an embodiment, a crystal oscillator control system includes a digital calibration loop working with an analog automatic level control loop to optimize oscillation amplitude and drive level. The system includes a clock cycle counter that monitors oscillation cycles and triggers a comparison between a peak envelope signal and a programmable reference swing voltage. Based on this comparison, a bias current modifier circuit adjusts a bias current code to optimize oscillation amplitude. The digital calibration process occurs at each startup, beginning with a maximum bias current code to ensure reliable startup, then systematically reducing the current to achieve the target oscillation amplitude.

20 Claims, 4 Drawing Sheets

200

BIAS CONTROL CIRCUIT FOR CRYSTAL OSCILLATOR

TECHNICAL FIELD

The present disclosure generally relates to electronic systems and, in particular embodiments, to a bias control circuit for a crystal oscillator.

BACKGROUND

Crystal oscillators serve as critical timing elements in electronic systems, providing precise frequency references for a wide range of applications. These oscillators typically employ quartz crystals due to their stability characteristics and piezoelectric properties. When properly designed, crystal oscillators can maintain frequency accuracy over varying environmental conditions and throughout the lifetime of a device.

In electronic systems, crystal oscillators create a feedback loop with an amplifier circuit that compensates for the losses in the crystal. The crystal behaves as a resonant circuit with specific electrical characteristics, including equivalent series resistance (ESR), motional inductance, and capacitance. These parameters collectively determine how the crystal responds when excited by an electrical signal.

The operation of crystal oscillators involves maintaining sustained oscillations at the crystal's resonant frequency. This requires sufficient energy to overcome the crystal's losses while ensuring the oscillation amplitude remains within acceptable limits. The amplifier in the oscillator circuit generates negative resistance (NEGRES) that counteracts the crystal's ESR, allowing oscillations to build up and maintain a steady state.

Crystal oscillator performance depends on several parameters, including drive level, oscillation amplitude, and startup time. Drive level refers to the power dissipated in the crystal during operation and directly impacts crystal reliability and aging characteristics. Oscillation amplitude affects the stability of the oscillator and its immunity to external noise sources. Startup time measures how quickly the oscillator can establish stable oscillations from a powered-off state.

Temperature variations impact crystal oscillator behavior, affecting frequency stability and oscillation characteristics. Crystal parameters such as ESR can vary with temperature, requiring oscillator circuits to maintain proper operation across the specified temperature range. Additionally, manufacturing variations in crystals necessitate oscillator designs that can accommodate a range of crystal parameters while maintaining reliable performance.

Modern electronic systems often require crystal oscillators to operate efficiently across various conditions while supporting different crystal types from multiple vendors. This can present challenges as a single oscillator circuit must accommodate variations in crystal parameters while maintaining reliable startup, stable operation, and appropriate drive levels.is desirable.

SUMMARY

Technical advantages are generally achieved by embodiments of this disclosure, which describe a bias control circuit for a crystal oscillator.

A first aspect relates to a crystal oscillator control circuit comprising a clock cycle counter configured to count oscillation cycles at an output of a crystal oscillator circuit and generate a trigger signal after a number of cycles; a clocked comparator coupled to receive a peak envelope signal from the crystal oscillator circuit and a programmable reference swing voltage, wherein the clocked comparator is configured to compare the peak envelope signal to the programmable reference swing voltage in response to the trigger signal from the clock cycle counter; and a bias current modifier circuit coupled to receive an output from the clocked comparator and a first bias current code, wherein the bias current modifier circuit, at each startup of the crystal oscillator, is configured to set a second bias current code to the maximum bias current code in response to the peak envelope signal being less than the programmable reference swing voltage and the first bias current code being at the maximum bias current code, generate the second bias current code by decreasing the first bias current code in response to the peak envelope signal being greater than the programmable reference swing voltage, generate the second bias current code by increasing the first bias current code by one binary step in response to the peak envelope signal being less than the programmable reference swing voltage, and set the second bias current code to a minimum bias current code in response to the first bias current code being at the minimum bias current code.

A second aspect relates to a crystal oscillator system comprising a crystal oscillator circuit including a buffer and filter circuit configured to provide a filtered reference signal, a peak detector circuit configured to generate a peak envelope signal, a bias amplifier coupled to generate a bias current based on a bias current code, the filtered reference signal, and the peak envelope signal, a crystal oscillator amplifier configured to generate oscillations for a crystal based on the bias current generated by the bias amplifier, and a Schmitt trigger circuit coupled to the crystal oscillator amplifier and configured to generate clock signals; and a bias control circuit coupled to the crystal oscillator circuit, the bias control circuit including a clock cycle counter configured to count a number of cycles of the clock signals and generate a trigger signal, a clock comparator configured to compare the peak envelope signal to the programmable reference swing voltage in response to the trigger signal, and a bias current modifier circuit configured to generate an optimized bias current code based on an output of the clock comparator.

A third aspect relates to a method for controlling a crystal oscillator, the method comprising initiating a digital calibration process at startup of the crystal oscillator by setting a bias current code to a maximum value; counting a number of oscillation cycles of the crystal oscillator; comparing, after the number of oscillation cycles, a measured oscillation swing to a reference swing; decreasing the bias current code in response to the measured oscillation swing being greater than the reference swing; increasing the bias current code in response to the measured oscillation swing being less than the reference swing, wherein, in response to the bias current code being at the maximum value and the measured oscillation swing being less than the reference swing, the bias current code is set to the maximum value; and exiting the digital calibration process in response to the measured oscillation swing being less than the reference swing or the bias current code equals a minimum value.

Embodiments can be implemented in hardware, software, or any combination thereof.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

Figure 1:
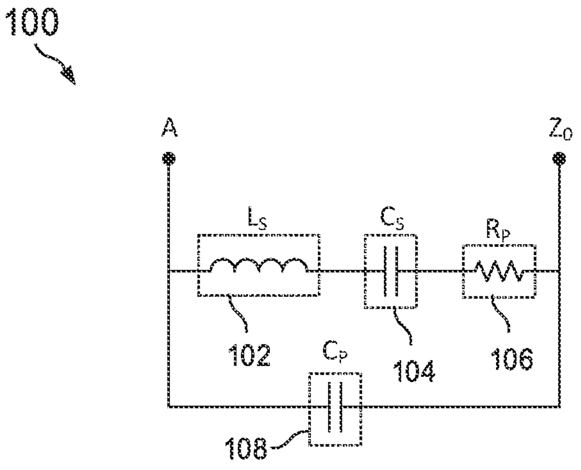
FIG. 1 is a schematic of the Butterworth-Van Dyke (BVD) equivalent circuit model of a quartz crystal resonator.

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise. Various embodiments are illustrated in the accompanying drawing figures, where identical components and elements are identified by the same reference number, and repetitive descriptions are omitted for brevity.

Variations or modifications described in one of the embodiments may also apply to others. Further, various changes, substitutions, and alterations can be made herein without departing from the spirit and scope of this disclosure as defined by the appended claims.

While the inventive aspects are described primarily in the context of crystal oscillator circuits with automatic amplitude control, it should also be appreciated that these inventive aspects may also apply to various oscillator implementations requiring drive-level management. In particular, aspects of this disclosure may similarly apply to oscillator circuits operating across different frequency ranges and with different crystal specifications where optimized current consumption and controlled oscillation amplitude can provide benefits.

In embodiments, a crystal oscillator control system manages oscillation amplitude and drive level. The control system includes a digital calibration loop with an analog automatic level control (ALC) loop for optimizing current consumption while maintaining reliable operation. This approach addresses challenges associated with supporting multiple crystal types with varying specifications in a single oscillator design.

Aspects of the disclosure disclose a clock cycle counter that monitors oscillation cycles and triggers a comparison between a peak envelope signal and a programmable reference swing voltage. Based on this comparison, a bias current modifier circuit can adjust a bias current code to optimize oscillation amplitude. The digital calibration process may occur at each startup, beginning with a maximum bias current code to ensure reliable startup, then systematically reducing the current to achieve the target oscillation amplitude.

The control system can reduce drive levels in high-current scenarios while maintaining appropriate levels where drive levels are already low. This selective optimization helps support crystals with lower drive-level specifications without compromising startup reliability. Additionally, the approach can reduce oscillation amplitude variations across process, voltage, and temperature (PVT) conditions by providing more precise control over the swing voltage.

The control system can achieve more optimal current consumption than existing solutions by implementing coarse tunings through the digital calibration loop and fine-tuning through the ALC loop. The digital loop can perform step adjustments to bring the bias current into an appropriate range, while the analog loop can provide continuous fine adjustment to maintain stable operation.

The control system can improve aging performance since the digital calibration runs at each startup, automatically compensating for any degradation in, for example, the amplifier or crystal over time. This approach enhances robustness while maintaining sufficient negative resistance during startup to ensure reliable oscillation initiation.

These improvements may be achieved with minimal additional circuitry, primarily digital, resulting in low area overhead. The programmable reference swing voltage allows the same oscillator design to be used in different environments, such as high-noise conditions where larger swing amplitudes may benefit electromagnetic compatibility. These and additional details are further discussed below.

FIG. 1 illustrates a schematic of the Butterworth-Van Dyke (BVD) equivalent circuit model 100 of a quartz crystal resonator. The BVD model represents the electrical behavior of a crystal by modeling its mechanical properties with electrical components. The equivalent circuit model 100 includes a first terminal A and a second terminal $Z_0$, representing the coupling points where the crystal interfaces with an oscillator circuit.

The BVD equivalent circuit model 100 has two branches. The first is a series branch comprising a series inductance ($L_S$) 102, a series capacitance ($C_S$) 104, and a series resistance ($R_P$) 106. These components collectively represent the motional arm of the crystal.

The series inductance ($L_S$) 102 represents the effective mass of the vibrating crystal element, the series capacitance ($C_S$) 104 represents the mechanical elasticity of the crystal, and the series resistance ($R_P$) 106 represents the equivalent series resistance (ESR) or the motional resistance that accounts for energy losses in the crystal.

The second branch includes a parallel capacitance ($C_P$) 108 coupled between the first terminal A and the second terminal $Z_0$. This capacitor represents the static capacitance formed by the crystal electrodes and package.

For reliable oscillation, an oscillator circuit may introduce negative resistance (R') in parallel to the series branch and the parallel capacitance branch across the first terminal A and the second terminal $Z_0$. This negative resistance (R') at start-up can be 4 to 5 times the value of the series resistance ($R_P$) 106. The negative resistance compensates for the losses represented by the series resistance ($R_P$) 106, allowing sustained oscillation.

The drive level of the crystal, which affects reliability and power consumption, can be calculated as the product of the square of the RMS current through the crystal and the series resistance ($R_P$) 106. Alternatively, it can be expressed in the peak-to-peak voltage, oscillation frequency, or load capacitance. These relationships highlight how controlling the current through the crystal can directly impact the drive level and oscillation amplitude.

The large variation between specified datasheet values and actual values of the series resistance ($R_P$) 106 presents a design challenge. Crystal manufacturers typically specify maximum ESR values (e.g., 50 ohms for a 40 MHz crystal)

substantially higher than typical measured values (8-10 ohms). Oscillator designers must accommodate this wide range, creating a difficult trade-off situation.

When designing for the maximum specified resistance (50 ohms), oscillator circuits typically incorporate negative resistance (R') that is 4-5 times higher (200-250 ohms) to ensure reliable startup across all crystal variations. However, when such circuits are used with typical crystals with much lower actual resistance (8-10 ohms), the negative resistance incorporated in the design becomes excessive by 20-25 times the actual crystal resistance.

This excessive negative resistance target leads to increase of power in amplifier which also increases the oscillation amplitudes & drive level. According to the relationship between drive level, peak-to-peak voltage, and series resistance, when the actual series resistance is 5 times lower than the specified maximum, the oscillation amplitude can increase by more than 100%. These higher amplitudes may approach or exceed supply voltage limitations, creating reliability concerns and potential device damage.

Conversely, if the oscillator design attempts to limit amplitude by reducing negative resistance to accommodate typical crystals, it risks startup failures when occasionally encountering crystals with higher resistance values closer to the specified maximum.

The conventional solution employs an Automatic Level Control (ALC) loop that attempts to regulate current after oscillation begins. However, ALC loops have a limited range and cannot fully compensate for the wide variation in crystal parameters. Typically, ALC loops can only adjust a portion of the total current, leaving a significant fixed component that unnecessarily consumes power. This fixed portion can be reduced to have better results using standalone ALC, but it always comes with a potential risk of loop stability, which needs to be avoided.

This inefficiency can become particularly problematic across process, voltage, and temperature (PVT) variations, where the fixed current component prevents optimal drive level reduction. The result is higher power consumption and increased crystal drive levels, which may exceed certain crystals' maximum specifications, accelerating aging and reducing long-term reliability.

The challenge is further complicated when a single oscillator design must support multiple crystal types from different vendors, each with its variation ranges. A more adaptive approach is needed to accommodate these variations while maintaining reliable startup, controlling oscillation amplitude, and optimizing power consumption.

Figure 2:
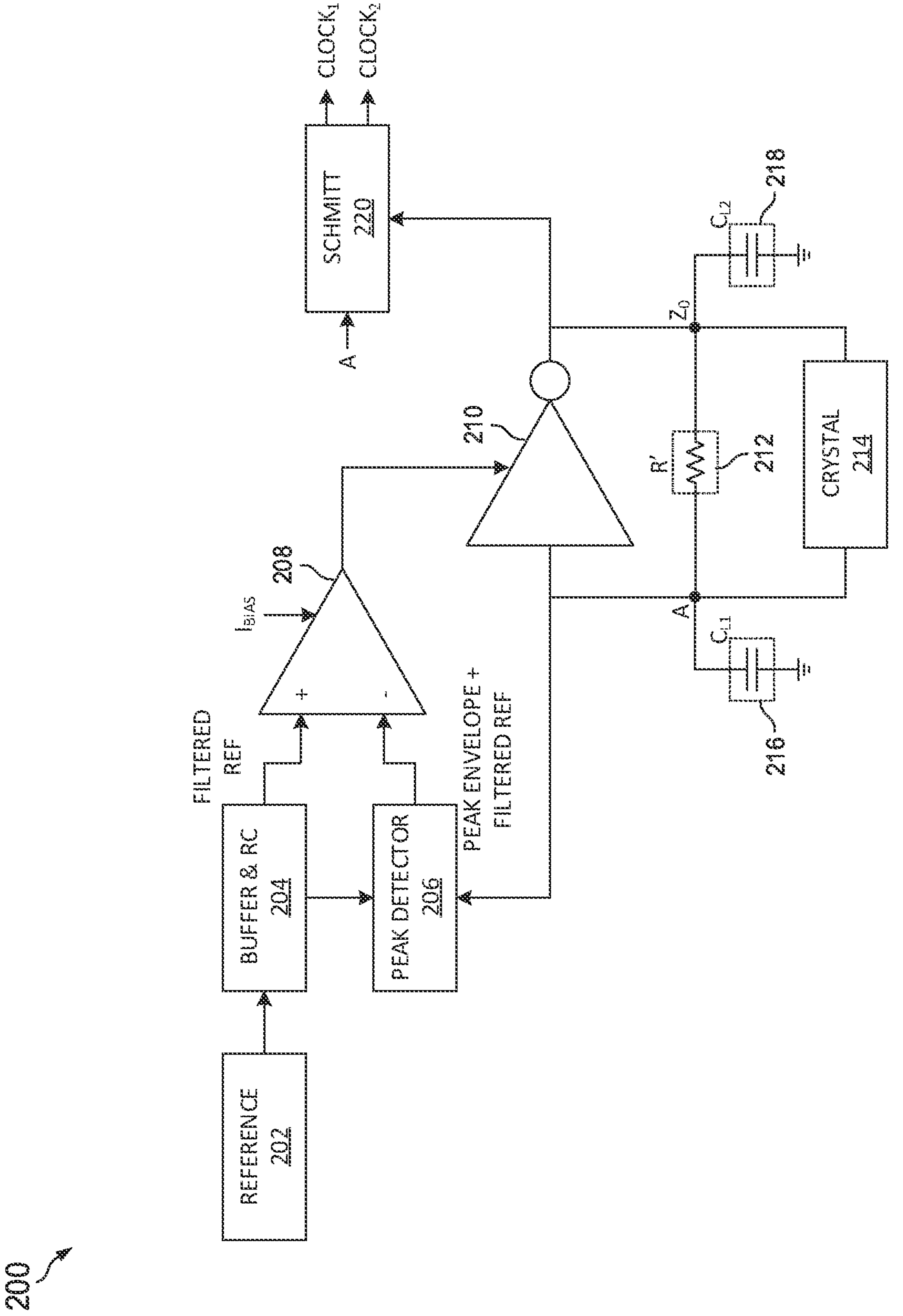
FIG. 2 is a block diagram of a crystal oscillator circuit with an automatic level control (ALC) loop to regulate oscillation amplitude.

FIG. 2 illustrates a block diagram of a crystal oscillator circuit 200 with an automatic level control (ALC) loop to regulate oscillation amplitude. Crystal oscillator circuit 200 is configured to generate and maintain stable oscillations for crystal 214, which can be represented as the equivalent circuit model 100 of FIG. 1.

Crystal oscillator circuit 200 includes a reference circuit 202, a buffer and filter circuit 204, a peak detector circuit 206, an amplifier 208, a crystal oscillator amplifier 210, a first load capacitor ($C_{L1}$) 216, a second load capacitor ($C_{L2}$) 218, and a Schmitt trigger circuit 220. The crystal oscillator circuit 200 is coupled to the crystal 214 at the first terminal A and the second terminal $Z_0$. The negative resistance (R') of the crystal 214 is represented by the negative resistance (R') 212.

The reference circuit 202 generates an internal voltage reference, which is typically called the bandgap reference (BGR), along with bias currents. The bandgap reference is not fed directly to other components because it can couple back due to oscillations, so it passes through the buffer and filter circuit 204, which provides isolation and filtering (e.g., RC filtering).

The buffer and filter circuit 204 is configured to provide a filtered reference signal to the amplifier 208 and the peak detector circuit 206. The peak detector circuit 206 extracts the oscillation envelope from the oscillator output and provides this envelope signal to amplifier 208 to control the oscillation amplitude.

The amplifier 208, operating within an ALC loop, receives a digital bias current (IBIAS) code, the filtered reference signal from the buffer and filter circuit 204, and the peak envelope and the reference signal from the peak detector circuit 206. The extracted oscillation envelope drives the amplifier 208 and regulates the current in the amplifier 208 to limit the oscillation amplitude. The output of the amplifier 208 is a bias current provided to the crystal oscillator amplifier 210.

A controller (not shown) is coupled to the crystal oscillator circuit 200 and provides the digital bias current ($I_{BIAS}$) code to the amplifier 208. This controller may be implemented as a digital logic circuit to set the appropriate digital bias current ($I_{BIAS}$) code value based on system requirements. In conventional implementations, the controller typically sets a fixed digital bias current ($I_{BIAS}$) code that remains constant during operation. This fixed approach ensures reliable startup but lacks the adaptability to optimize current consumption and drive level during steady-state operation across varying crystal parameters and operating conditions.

The crystal oscillator amplifier 210 is coupled to the output of amplifier 208, and driven by the bias current provided by the amplifier 208. Crystal oscillator amplifier 210 generates the oscillation between the first terminal A and the second terminal $Z_0$. In embodiments, crystal oscillator amplifier 210 is a Pierce oscillator or an amplifier that generates a negative resistance for crystal loss compensation.

The crystal oscillator amplifier 210, in addition to generating the oscillation for crystal 214, provides a feedback signal to the peak detector circuit 206, which extracts the oscillation envelope from this signal. This feedback path allows the peak detector circuit 206 to monitor the envelope of the oscillation amplitude at the output of the crystal oscillator amplifier 210 and detect the oscillation peak (i.e., max envelope).

When the max envelope approaches the reference, as observed through the inputs of the amplifier 208, the bias current reduces as the oscillation amplitude rises. The bias current becomes constant once the envelope is in a similar range as the reference. This control mechanism reduces the oscillation amplitude and the current in main amplifier, bringing the system down to a sustained mode of oscillation.

The crystal 214 is coupled between the first terminal A and the second terminal $Z_0$, with the first load capacitor ($C_{L1}$) 216 and the second load capacitor ($C_{L2}$) 218 coupled from these terminals to ground. These load capacitors, along with the crystal 214, determine the oscillation frequency ($f_p$), which can be expressed as $$f_p = \frac{1}{2\pi\sqrt{L_1 \times C_1}}\sqrt{\left(1 + \frac{C_1}{C_0 + C_L}\right)} \cong \frac{1}{2\pi\sqrt{L_1 \times C_1}}\left(1 + \frac{C_1}{C_0 + C_L}\right),$$

where $L_1$ represents the motional inductance of the crystal, $C_1$ represents the motional capacitance, $C_0$ represents the static capacitance, and CL represents the effective load capacitance seen by the crystal (a combination of $C_{L1}$, $C_{L2}$, and any parasitic capacitance). This equation demonstrates how the load capacitance affects the actual oscillation frequency.

The Schmitt trigger circuit 220 is coupled to the first terminal A and the second terminal $Z_0$. The Schmitt trigger circuit 220 converts the sinusoidal oscillation signal into square clock pulse signals ($CLOCK_1$ and $CLOCK_2$) that can drive subsequent digital circuits (system-on-chip (SoC)).

In this design, the ALC loop monitors the oscillation amplitude through the peak detector circuit 206 and adjusts the current in amplifier 208 to limit the oscillation amplitude. This control is determined by the digital bias current ($I_{BIAS}$) code and the ALC code settings, as shown as an example in Table 1 below:

TABLE 1

| IBIAS Code/Current | ALC Code | Fixed | Variable |
|---|---|---|---|
| 100 (5 I) | 00 | 80% (4 I) | 20% (I) |
| 100 (5 I) | 11 | 20% (I) | 80% (4 I) |
| 111 (8 I) | 11 | 20% (1.6 I) | 80% (6.4 I) |

As discussed, the amplifier 208 operates as part of the ALC loop, which has a minimum setting and a maximum setting that can be set by the ALC code. The digital bias current ($I_{BIAS}$) code defines how much current is pumped into the amplifier 208 as a quotient current. For example, a digital bias current ($I_{BIAS}$) code '100' provides a quotient current of 5I, while digital bias current ($I_{BIAS}$) code '111' provides 81, where "I" represents a unit of current.

The ALC code determines how much of this current can be regulated by the ALC loop. With ALC code '00' (minimum gain setting), 80% of the current remains fixed, while only 20% can be varied by the ALC loop. With ALC code '11' (maximum gain setting), only 20% of the current remains fixed, while 80% can be varied. This division between fixed and variable current creates a limitation: even when the ALC loop is at maximum regulation (ALC code '11'), a portion of the current (20%) remains fixed and cannot be reduced. This prevents the system from achieving optimal current consumption in steady state. But lowering this fixed value too much isn't a solution, since this can impact loop stability.

For a given digital bias current ($I_{BIAS}$) code of '100' (5I) and ALC code of '00', the current can only be reduced from 5I to 4I as the oscillation builds up. With the same digital bias current ($I_{BIAS}$) code but ALC code '11', the current can be reduced from 5I to I, providing greater control over the oscillation amplitude. The digital bias current ($I_{BIAS}$) code guarantees the startup of the oscillator system, ensuring sufficient current is available initially. However, this high current level is no longer necessary for maintaining steady-state oscillation once oscillation begins.

The transconductance ($g_M$) of amplifier 208 directly affects the negative resistance generated between the first terminal A and the second terminal $Z_0$. The relationship between negative resistance (R'), transconductance ($g_M$), and capacitive loading can be expressed as $$R' = \frac{-g_M}{\omega^2 \times C_{L1} \times C_{L2}},$$

where ω is the angular frequency of operation.

As oscillation stabilizes, the negative resistance (R') requirements decrease, but with a fixed portion of current that cannot be reduced, the circuit continues to generate excessive negative resistance than required. This results in unnecessarily high RMS current ($I_{RMS}$) through the crystal, directly increasing the drive level beyond what is required for stable operation. The drive level ($D_L$) can be calculated as $$D_L = I_{RMS}^2 \times R_{ESR},$$

where $R_{ESR}$ represents the equivalent series resistance or motional resistance ($R_M$) of the crystal. This equation shows how higher RMS current directly increases the drive level, potentially exceeding the crystal's specification.

This approach has limitations. With a fixed digital bias current ($I_{BIAS}$) code, the circuit may consume unnecessarily high current in steady state when the negative resistance requirements have decreased after startup. This inefficiency becomes more pronounced across process, voltage, temperature, and capacitance variations.

Additionally, the significant difference between the maximum specified ESR of crystals (approximately 50 ohms for a 40 MHz crystal) and typical measured values (8-10 ohms) results in excessive oscillation amplitude at the first terminal A and the second terminal $Z_0$, potentially causing reliability issues.

The peak-to-peak voltage ($V_{PPMAX}$) between the first terminal A and the second terminal $Z_0$ is directly related to the negative resistance (R') and the ESR of the crystal. With the significant discrepancy between specified and actual ESR values, the voltage swing can become excessive, approaching the reliability limits of the circuit.

Alternatively, the drive level ($D_L$) can be expressed in terms of the peak-to-peak voltage as $$D_L = \frac{R_{ESR} \times (V_{PPMAX} \times F_{OSC} \times C_{L1,L2})^2}{2},$$

where $F_{OSC}$ is the oscillation frequency. This equation demonstrates how excessive voltage swing directly increases the drive level, highlighting the importance of controlling oscillation amplitude.

Figure 3:
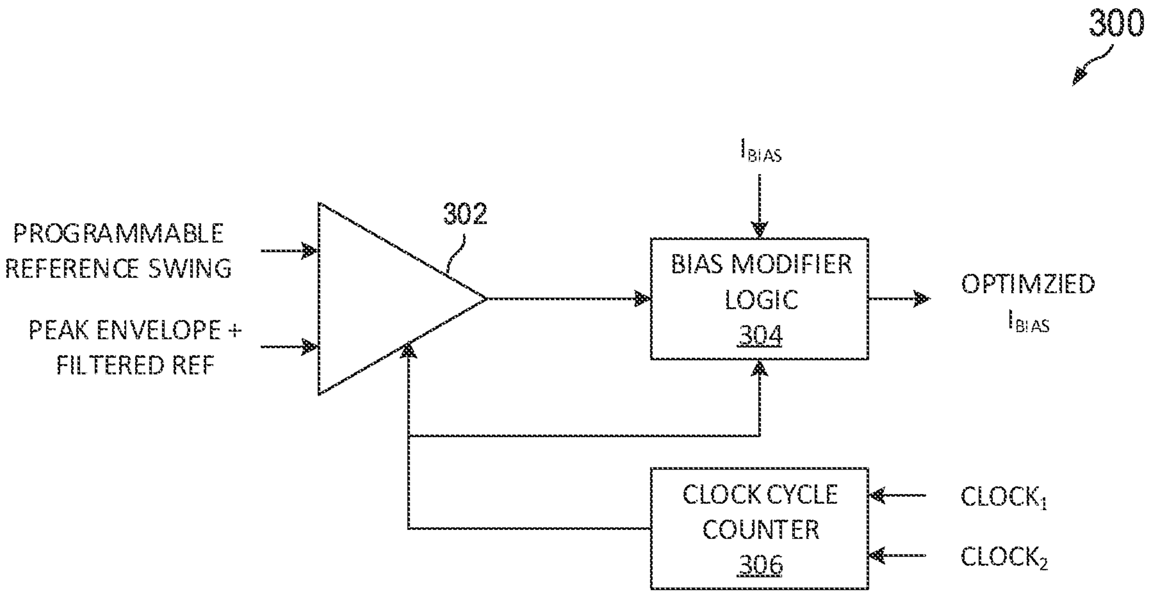
FIG. 3 is a block diagram of an embodiment bias control circuit that can be coupled to the crystal oscillator circuit of FIG. 2.

FIG. 3 illustrates a block diagram of an embodiment bias control circuit 300 that can be coupled to the crystal oscillator circuit 200 of FIG. 2. The bias control circuit 300 includes a clock comparator 302, a bias current modifier circuit 304, and a clock cycle counter 306, which may (or may not) be arranged as shown. The bias control circuit 300 implements a digital calibration loop that works with the analog ALC loop of crystal oscillator circuit 200 to optimize the oscillation amplitude and drive level of crystal 214.

The clocked comparator 302 receives a programmable reference swing from a controller as a first input. In embodiments, the reference swing can be programmed by a user of the device hosting the circuit. The programmable reference swing can be set based on knowledge from initial simulations. For example, simulations may show that with an ALC code equal to '11', the swing will range from approximately 1.3V to 0.65V. This established range allows for configurable swing values to be provided to users, such as settings from 700 mV to 1.2V with steps of 100 mV or 200 mV. Users can specify how much swing they want the system to have—whether closer to 1.2V or 1.3V for higher amplitude operation, closer to 0.7V for lower amplitude operation, or something in between. This programmability enables the system to be tailored to specific application requirements and operating environments.

This programmable reference swing represents the target oscillation amplitude desired for the crystal oscillator. The second input of the clock comparator 302 is coupled to the output of the peak detector circuit 206 of FIG. 2, receiving the peak envelope signal and filtered reference signal. The peak envelope component represents the actual oscillation amplitude of the crystal oscillator, while the filtered reference component provides a stable reference level. This combination allows the clock comparator 302 to accurately evaluate whether the current oscillation amplitude meets the target reference swing, even in the presence of noise or variations in operating conditions.

The clock cycle counter 306 receives as inputs the clock signals ($CLOCK_1$ and $CLOCK_2$) from the Schmitt trigger circuit 220 of FIG. 2. The clock cycle counter 306 is configured to count a programmable number (N) of oscillation cycles and generate a trigger signal upon reaching this count. In embodiments, the programmable number (N) is set to 1000 cycles.

In some embodiments, the clock cycle counter 306 can be implemented as a counter with a variable cycle count. For example, immediately after startup, the counter may be configured to use a lower cycle count for the initial evaluations, particularly for the first cycle, due to the high bias current present at startup. The cycle count can be increased as the digital bias current ($I_{BIAS}$) code is reduced through successive iterations. This variable approach allows for more rapid initial adjustments when the current is significantly higher than optimal, followed by more measured adjustments as the current approaches the target range.

The bias current modifier circuit 304 is coupled to the output of the clock comparator 302. It receives the digital bias current ($I_{BIAS}$) code that would normally be provided directly to the amplifier 208 in crystal oscillator circuit 200.

The bias current modifier circuit 304, through modifier logic circuits, processes these inputs and generates an optimized digital bias current ($I_{BIAS}$) code, which replaces the original digital bias current ($I_{BIAS}$) code provided to the amplifier 208 in the crystal oscillator circuit 200.

Accordingly, within the given limits established by the programmable reference swing, the bias control circuit 300 operates during startup when the oscillator initially has very high negative resistance. As the oscillations begin to build, they continue to increase in amplitude. The clock cycle counter 306 monitors these developing oscillations and, after counting N cycles, generates a trigger signal for the clock comparator 302.

As oscillations develop, the peak envelope signal detected by the peak detector circuit 206 also rises in amplitude. When the clock cycle counter 306 is triggered, the clock comparator 302 compares this peak envelope signal against the programmable reference swing. The comparator then determines whether the current swing is higher or lower than the target reference swing.

If the comparator 302 determines that the measured swing is higher than the reference swing, the bias current modifier logic circuit 304 reduces the digital bias current ($I_{BIAS}$) code, decreasing the current provided to the amplifier 208. Conversely, if the swing is lower than the reference swing, the bias current modifier logic circuit 304 increases the digital bias current ($I_{BIAS}$) code. This decision-based adjustment mechanism allows the system to optimize the oscillation amplitude to match the target reference swing.

The bias control circuit 300 provides coarse tuning of the bias current, whereas the ALC loop in the crystal oscillator circuit 200 provides fine tuning. This two-stage approach allows for a more comprehensive optimization of current consumption and oscillation amplitude than either method could achieve independently.

The bias control circuit 300 provides several advantages over conventional crystal oscillator designs. Startup is guaranteed by using the maximum digital bias current ($I_{BIAS}$) code as an initial setup point. The digital loop allows for coarse tuning of the bias current without modifying the negative resistance portion during startup, which is advantageous for reliable oscillation initiation.

The digital calibration process enables significant RMS current ($I_{RMS}$) reduction through the crystal, resulting in a reduced drive level ($D_L$). This is particularly beneficial for supporting crystals with lower drive level specifications without compromising reliability.

Oscillation amplitude variation, which can be as high as 100% in conventional designs, is substantially reduced by setting an appropriate reference swing. The second loop through the digital calibration process further reduces swing variation across operating conditions.

While the digital loop provides coarse adjustment of the bias current, reduces transconductance, and, thus, negative resistance, the ALC fine tuning in the crystal oscillator circuit 200 also continues to adjust resistance closer to the crystal effective resistance during steady-state operation. This combination ensures that sufficient negative resistance is maintained for stable oscillation while optimizing current consumption and drive level.

Figure 4:
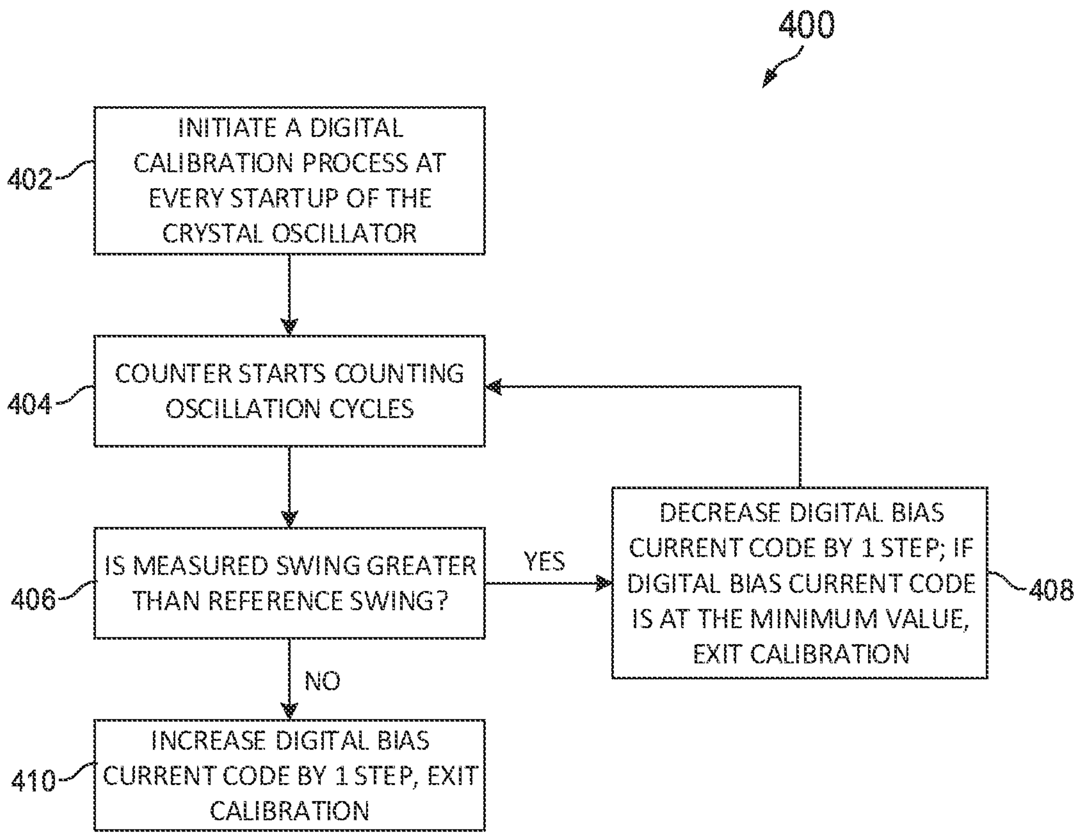
FIG. 4 is a flowchart of an embodiment method for operating the bias control circuit.

FIG. 4 illustrates a flowchart of an embodiment method 400 for operating the bias control circuit 300. In various embodiments, the method may include additional or fewer steps, or the steps may be performed differently than illustrated.

At step 402, at every crystal oscillator startup, the bias control circuit 300 initiates a digital calibration process. The digital bias current ($I_{BIAS}$) code is set to the maximum value instead of a default code, ensuring a high current that guarantees reliable oscillator startup. Simultaneously, the target swing is set at the first input of the clock comparator 302. This reference swing can be programmed based on pre-learning from computer-aided design (CAD) simulations plus an appropriate margin.

At step 404, once oscillation begins, the clock cycle counter 306 starts counting oscillation cycles. When the counter reaches N cycles (e.g., 1000 cycles), it triggers the clock comparator 302 to evaluate the current oscillation amplitude against the target reference swing.

At step 404, once oscillation begins, the clock cycle counter 306 starts counting oscillation cycles. In embodiments, when the counter reaches N cycles (e.g., 1000 cycles), it triggers the clock comparator 302 to evaluate the current oscillation amplitude against the target reference swing.

In some embodiments, the clock cycle counter 306 may alternatively use a variable cycle count approach, where a lower number of cycles is counted during initial iterations when the digital bias current ($I_{BIAS}$) code is high, and a higher number of cycles is counted in subsequent iterations as the digital bias current ($I_{BIAS}$) code decreases.

For example, the first evaluation might occur after only a few hundred cycles, while later evaluations might use the full 1000 cycles. This variable approach allows for faster initial adjustments when the current is significantly higher than optimal.

At step 406, the method determines if the measured swing is greater than the reference swing based on the output of the clock comparator 302. If yes, the process proceeds to step 408. If no, the process proceeds to step 410.

At step 408, if the measured swing is greater than the reference swing, the bias current modifier circuit 304 decreases the digital bias current ($I_{BIAS}$) code by one binary step. The method determines if the digital bias current ($I_{BIAS}$) code equals one. If yes, the process exits the calibration process. If no, the process returns to step 404, with the clock cycle counter 306 resetting and beginning another count of N cycles. This iterative reduction continues until the measured swing falls below the reference swing or the digital bias current ($I_{BIAS}$) code reaches its minimum value of one.

At step 410, if the measured swing is less than the reference swing, the bias current modifier circuit 304 increases the digital bias current ($I_{BIAS}$) code by one binary step and then exits the calibration process. This final increment ensures that the digital bias current ($I_{BIAS}$) code is slightly higher than the minimum required, allowing the ALC loop in the crystal oscillator circuit 200 to perform fine-tuning adjustments during steady-state operation.

It should be appreciated that in embodiments, if during the first evaluation (at maximum possible code) the swing achieved is less than target reference swing, the loop exits at the maximum code possible scenario (in the first evaluation), hence the final output code is equal to max code (e.g., 7) and not equal to max code+1.

The bias control circuit 300 and method 400 are designed to operate reliably across a wide temperature range, typically from −40° C. to 125° C. These temperature variations can impact the crystal and the oscillator circuit's performance characteristics, making the bias control's adaptive nature particularly valuable.

Performance data demonstrates the effectiveness of the bias control circuit 300 compared to conventional reference designs. When crystal parameter variations are included in the analysis, the proposed design substantially improves drive level and peak amplitude stability across process, voltage, and temperature (PVT) variations. At temperature extremes such as −40° C. and 125° C., the maximum-to-minimum ratio of drive levels is significantly reduced compared to conventional designs, providing more consistent operation across the entire temperature range.

Similarly, the peak amplitude variation (expressed as a maximum-to-minimum ratio) is substantially reduced with the bias control circuit 300. This stability is improved by combining coarse digital calibration at startup and continuous fine-tuning through the ALC loop during steady-state operation.

Even when crystal parameters are held constant and only process and voltage conditions are varied, the bias control circuit 300 continues to demonstrate superior performance compared to conventional designs. These improvements are particularly evident when voltage is varied while temperature remains constant, or when temperature varies while voltage remains constant.

One consideration in implementing the digital calibration process of method 400 is the potential impact on startup time. The calibration process requires sufficient time for the peak detector circuit 206 to settle to proper values at each evaluation step to avoid incorrect decisions. In some cases, particularly with certain crystal elements, a higher number of cycles may be needed for accurate evaluation. While the typical setting is 1,000 cycles per step, some applications may require up to 10,000 to 20,000 cycles per step to ensure proper settling. This trade-off between optimization precision and startup time can be managed through the programmable nature of the clock cycle counter 306, allowing the system to be tailored to specific application requirements and crystal characteristics.

The bias control circuit 300 provides several improvements over conventional crystal oscillator designs. Drive level drift is substantially reduced across temperature and process variations, resulting in more consistent crystal operation and extended reliability. Similarly, voltage level drift is minimized, ensuring more stable operation across varying conditions.

The approach effectively resolves the issue of highly variable swing across process, voltage, and temperature (PVT) variations by dynamically adjusting the bias current based on actual measured oscillation amplitude. This controlled oscillation amplitude simplifies oscillator design while supporting crystals with lower drive-level specifications.

The programmable reference swing allows the same design to be used in different environments, such as increasing the target amplitude in noisy environments for better electromagnetic compatibility or reducing it in quiet environments for lower power consumption.

The digital calibration approach also addresses aging degradation in the amplifier and crystal. Since calibration occurs at each startup, the system automatically compensates for any degradation that may have occurred over time, providing enhanced long-term robustness without requiring manual recalibration or adjustment.

These improvements are achieved advantageously without compromising negative resistance during startup, ensuring reliable oscillation initiation. The architectural implementation guarantees proper startup by beginning with maximum bias current, while the digital nature of the additional loop prevents cross-interference with the analog ALC loop. This coarse and fine control separation relaxes the ALC loop gain, resulting in better stability and noise performance.

The power consumption of the crystal oscillator is significantly reduced in steady-state operation, as the bias current is optimized to the minimum level required for stable oscillation rather than remaining at a fixed high value. This power reduction is achieved with minimal area overhead, as the additional control loop is primarily digital. The design also allows for redundancy to be added for safety purposes, ensuring that any issues in the digital calibration path can be detected and corrected.

The single-point calibration approach provides an additional benefit of simplicity in implementation and testing while delivering comprehensive performance improvements across all operating conditions. This combination of enhanced performance, reduced power consumption, improved reliability, and design simplicity makes the bias control circuit particularly advantageous for modern electronic systems to support multiple crystal types with varying specifications.

Figure 5:
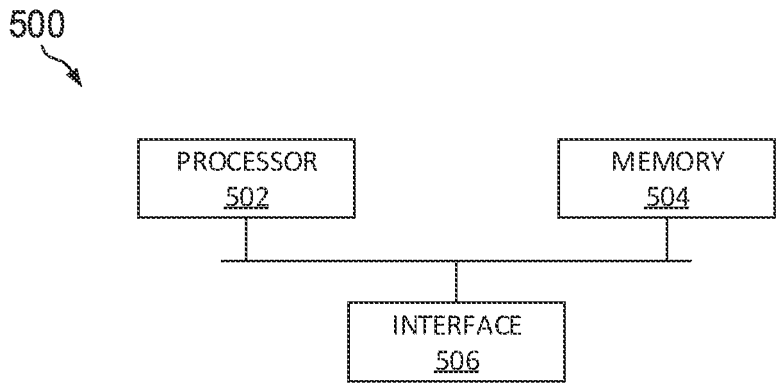
FIG. 5 is a block diagram of an embodiment controller.

FIG. 5 illustrates a block diagram of an embodiment controller 500, which can be coupled to the crystal oscillator circuit 200 and the bias control circuit 300 to set various control signals and parameters. The controller 500 includes a processor 502, a memory 504, and an interface 506, which may (or may not) be arranged as shown. Controller 500 may include additional components not shown.

Processor 502 may be implemented as a general-purpose processor, a digital signal processor (DSP), an application-specific integrated circuit (ASIC), a field programmable gate array (FPGA), or other programmable logic device. The processor 502 may also be implemented as a combination of computing devices, such as a microprocessor with a digital signal processor core, a combination of multiple microprocessors, or any other suitable configuration.

Memory 504 may include various types of memory devices, including volatile memory (e.g., random access memory (RAM)), non-volatile memory (e.g., read-only memory (ROM), flash memory, electrically erasable programmable read-only memory (EEPROM)), or a combination thereof. In embodiments, memory 504 is a non-transitory memory storage comprising instructions that, when executed by processor 502, cause the processor 502 to perform operations for controlling the crystal oscillator circuit 200 and the bias control circuit 300.

The interface 506 provides connectivity between the processor 502, the memory 504, and external circuits such as the crystal oscillator circuit 200 and the bias control circuit 300. Interface 506 may include digital-to-analog converters, analog-to-digital converters, level shifters, buffers, or other signal conditioning circuits to interface with the external circuits properly.

In operation, the controller 500 may be configured to provide various signals to the crystal oscillator circuit 200 and the bias control circuit 300, including but not limited to: the digital bias current ($I_{BIAS}$) code to the amplifier 208, the ALC code to set the variable current range, the programmable reference swing voltage to the clock comparator 302, and the programmable number of cycles (N) for the clock cycle counter 306. Controller 500 may also receive status signals from these circuits to monitor their operation.

The instructions stored in memory 504 may implement method 400 described in FIG. 4, including setting the digital bias current ($I_{BIAS}$) code to the maximum at startup, configuring the target reference swing, determining whether to increase or decrease the digital bias current ($I_{BIAS}$) code based on comparator output, and managing the variable cycle count approach when implemented. Controller 500 may also store calibration data and operational parameters determined during testing or previous operation cycles to optimize performance across different operating conditions.

In some embodiments, the controller 500 may be implemented as an external component separate from the crystal oscillator circuit 200 and the bias control circuit 300, allowing for flexible system integration. In other embodiments, the controller 500 may be integrated as part of either the crystal oscillator circuit 200 or the bias control circuit 300, providing a more compact solution with reduced interconnect requirements. This integration flexibility optimizes the system for different applications, balancing factors such as board space, power consumption, and design complexity based on specific implementation needs.

It is noted that all steps outlined in the method are not necessarily required and can be optional. Further, changes to the arrangement of the steps, removal of one or more steps and path connections, and addition of steps and path connections are similarly contemplated.

Figure 6:
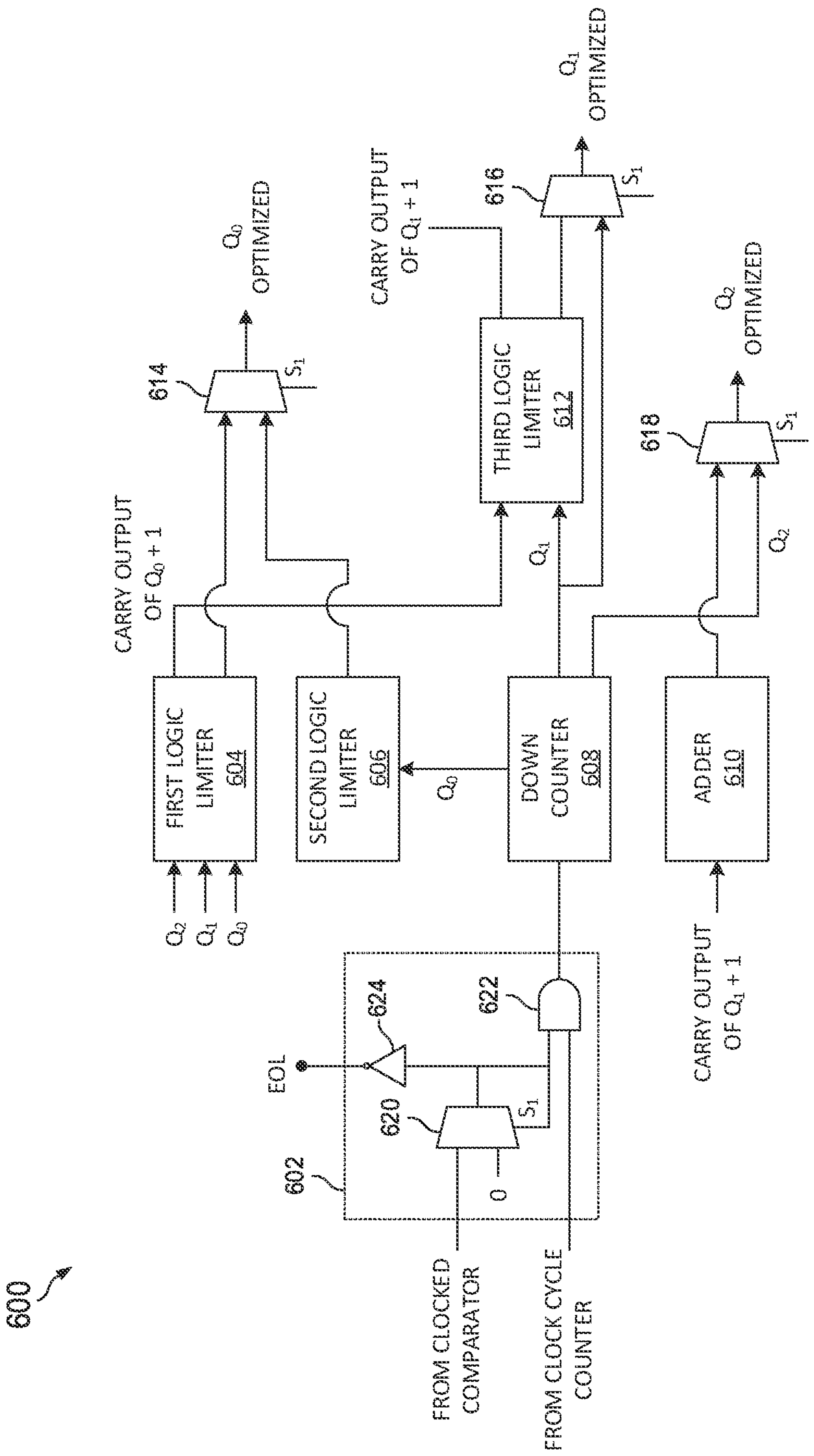
FIG. 6 is a block diagram of an embodiment bias modifier logic.

FIG. 6 illustrates a block diagram of an embodiment bias modifier logic 600, which can be implemented as the bias current modifier circuit 304 of FIG. 3. The bias modifier logic 600 includes a clock trigger circuit 602, a first logic limiter 604, a second logic limiter 606, a down counter 608, an adder 610, a third logic limiter 612, a first multiplexer 614, a second multiplexer 616, and a third multiplexer 618, which may (or may not) be arranged as shown. Bias modifier logic 600 may include additional components not shown, such as delay chains.

The clock trigger circuit 602 receives input from the clocked comparator 302 and the clock cycle counter 306. The clock trigger circuit 602 is configured to generate a gated clock trigger signal to the down counter 608 and to determine when to exit the calibration loop.

The clock trigger circuit 602 includes a fourth multiplexer 620, an AND gate 622, and an inverter 624, which may (or may not) be arranged as shown. Clock trigger circuit 602 may include additional components not shown. The output of the AND gate 622 provides the gated clock trigger signal to the down counter 608, while the output of the inverter 624 provides an end of loop (EL) signal. The output of the fourth multiplexer 620 provides the select signal ($S_1$) for the first multiplexer 614, the second multiplexer 616, the third multiplexer 618, and the fourth multiplexer 620.

In embodiments, in response to the measured swing being greater than the reference signal, as indicated by the output of the clocked comparator 302, the clock trigger circuit 602 asserts the end of loop signal.

The down counter 608 receives the gated clock trigger signal from the clock trigger circuit 602 and generates individual bit values: $Q_0$, $Q_1$, and $Q_2$, where the optimized bias current at the output of the bias modifier logic 600 is: '$Q_2$ $Q_1$ $Q_0$'. For example, the optimized bias current '100' corresponds to the bit value $Q_2$ being equal to '1' and bit values Q and $Q_0$ being equal to '0'.

The output of down counter 608 starts at '1 1 1' for bit values $Q_0$, $Q_1$, and $Q_2$. After each trigger edge of the gated clock trigger signal, while the measured swing is determined to be greater than the reference swing, as indicated by the output of the clocked comparator 302, the value of '$Q_2$ $Q_1$ $Q_0$' is reduced by '1', as discussed concerning step 408 of FIG. 4.

In embodiments, the down counter 608 may be implemented as an M-bit down counter. In embodiments, M equals 3. The down counter 608 is configured to count down from a maximum value (e.g., '111' for a 3-bit counter) to a minimum value (e.g., '001' or '000') at each clock trigger. It should be appreciated that although the bias modifier logic 600 is shown with M equal to three (i.e., with three bit values), this example is non-limiting and greater or fewer bit values are contemplated in other embodiments. Accordingly, the number of bits used in the counter and the specific logic implementation may vary based on system requirements and design constraints.

The first logic limiter 604 receives the individual bit values $Q_0$, $Q_1$, and $Q_2$ as inputs from the down counter 608. It is configured to increase the bias current code by '1' in response to the measured swing being greater than the reference swing, as discussed concerning step 410 of FIG. 4. The first logic limiter 604 generates two outputs: (i) a carry output (if any) by performing the operation $Q_0+1$, which is provided to the third logic limiter 612 and (ii) the added value which is provided to the first multiplexer 614. For example, if $Q_0$ is '1', then $Q_0+1$ gives two outputs: (i) Carry which is '1' and (ii) added value which is 0, thus 1+1 is equivalent to 10. Similarly, the third logic limiter 612 receives input $Q_1$ and the carry output from $Q_0+1$ addition and adds it with $Q_1$ and generates a carry output (if any) by performing the operation $Q_1+1$, which is provided to the adder 610 and the addition output to the second multiplexer 616.

The second logic limiter 606 receives the individual bit value $Q_0$ at its input and is configured to limit the bias current code to a minimum value (e.g., '001'). The adder 610 is coupled to receive the carry output of $Q_{1+1}$ from the third logic limiter 612. The adder 610 is configured to increase the MSB by '1' if there is a carry from previous bit addition in response to the comparator output being equal to zero or to set the bit value to the maximum bit value of '1', so that overall maximum code doesn't overflow and change from 111.

The first multiplexer 614 is configured to select between the output of the first logic limiter 604 and the second logic limiter 606 based on the select signal $S_1$ from the clock trigger circuit 602. The output of the first multiplexer 614 is the optimized $Q_0$ value. Similarly, the second multiplexer 616 selects between the output of the third logic limiter 612 and the bit value $Q_1$ from the down counter 608, providing the optimized $Q_1$ value. The third multiplexer 618 selects between bit value $Q_2$ from the down counter 608 and the output from the adder 610, providing the optimized $Q_2$ value.

When the comparator output equals '1' (indicating the generated swing is higher than the target reference swing), the first multiplexer 614, the second multiplexer 616, and the third multiplexer 618 select the standard $Q_0$, $Q_1$, and $Q_2$ outputs from the down counter 608. This reduces the bias current code with every evaluation as long as the actual swing exceeds the reference input swing.

When the comparator output equals 'o' (indicating the generated swing is lower than the target reference swing), the first multiplexer 614, the second multiplexer 616, and the third multiplexer 618 select the optimized bias current at the output of: '$Q_2$ $Q_1$ $Q_0$+1', and the loop exits. This is initially performed through the first logic limiter 604 by adding '1' to the individual bit value $Q_0$ and checking whether there is a carry (e.g., '011'+'001'='100', which includes a carry at the individual bit values $Q_0$ and $Q_1$). If there is a carry, the adder 610 adds the carry to individual bit value $Q_2$. Again, a check is made to determine whether a carry exists as a result of the addition. If there is a carry, the carry generated from $Q_1$ is added to the individual bit value $Q_2$ to get the final output.

It should be always noted that, there is a check to be made that the optimized bias current code does not exceed '111'. Likewise, there is a check to be made to set a minimum bias current code value at '001'. In embodiments, the down counter 608 includes this feature.

Once the loop exits (e.g., when the EoL signal is asserted), the trigger is masked, preventing the down counter 608 from continuing to count. At this point, the output of the bias modifier logic 600 is fixed at the desired optimized code.

It should be appreciated that in other embodiments, the bias current modifier circuit 304 may be implemented differently than that shown in FIG. 6. For example, an embodiment may eliminate the need for the second logic limiter 606 as shown in the diagram by implementing the feature in the down counter 608.

A first aspect relates to a crystal oscillator control circuit comprising a clock cycle counter configured to count oscillation cycles at an output of a crystal oscillator circuit and generate a trigger signal after a number of cycles; a clocked comparator coupled to receive a peak envelope signal from the crystal oscillator circuit and a programmable reference swing voltage, wherein the clocked comparator is configured to compare the peak envelope signal to the programmable reference swing voltage in response to the trigger signal from the clock cycle counter; and a bias current modifier circuit coupled to receive an output from the clocked comparator and a first bias current code, wherein the bias current modifier circuit, at each startup of the crystal oscillator, is configured to set a second bias current code to the maximum bias current code in response to the peak envelope signal being less than the programmable reference swing voltage and the first bias current code being at the maximum bias current code, generate the second bias current code by decreasing the first bias current code in response to the peak envelope signal being greater than the programmable reference swing voltage, generate the second bias current code by increasing the first bias current code by one binary step in response to the peak envelope signal being less than the programmable reference swing voltage, and set the second bias current code to a minimum bias current code in response to the first bias current code being at the minimum bias current code.

In a first implementation form of the crystal oscillator control circuit, according to the first aspect as such, the number of cycles counted by the clock cycle counter is programmable.

In a second implementation form of the crystal oscillator control circuit, according to the first aspect as such or any preceding implementation form of the first aspect, the number of cycles is variable based on a current value of the first bias current code.

In a third implementation form of the crystal oscillator control circuit, according to the first aspect as such or any preceding implementation form of the first aspect, the programmable reference swing voltage is configurable by a user.

In a fourth implementation form of the crystal oscillator control circuit, according to the first aspect as such or any preceding implementation form of the first aspect, the bias current modifier circuit is configured to set the first bias current code to a maximum value at each startup of the crystal oscillator.

In a fifth implementation form of the crystal oscillator control circuit, according to the first aspect as such or any preceding implementation form of the first aspect, the bias current modifier circuit is configured to iteratively decrease the first bias current code until the peak envelope signal is less than the programmable reference swing voltage or the first bias current code equals one.

In a sixth implementation form of the crystal oscillator control circuit, according to the first aspect as such or any preceding implementation form of the first aspect, the second bias current code is provided to an amplifier in the crystal oscillator to control a bias current for a crystal oscillator amplifier.

A second aspect relates to a crystal oscillator system comprising a crystal oscillator circuit including a buffer and filter circuit configured to provide a filtered reference signal, a peak detector circuit configured to generate a peak envelope signal, a bias amplifier coupled to generate a bias current based on a bias current code, the filtered reference signal, and the peak envelope signal, a crystal oscillator amplifier configured to generate oscillations for a crystal based on the bias current generated by the bias amplifier, and a Schmitt trigger circuit coupled to the crystal oscillator amplifier and configured to generate clock signals; and a bias control circuit coupled to the crystal oscillator circuit, the bias control circuit including a clock cycle counter configured to count a number of cycles of the clock signals and generate a trigger signal, a clock comparator configured to compare the peak envelope signal to the programmable reference swing voltage in response to the trigger signal, and a bias current modifier circuit configured to generate an optimized bias current code based on an output of the clock comparator.

In a first implementation form of the crystal oscillator system, according to the second aspect as such, the bias current modifier circuit is configured to set the bias current code to a maximum value at startup; decrease the bias current code in response to the peak envelope signal being greater than the programmable reference swing voltage; and increase the bias current code in response to the peak envelope signal being less than the programmable reference swing voltage, wherein the bias current code remains at the maximum value in response to the peak envelope signal being less than the programmable reference swing voltage and the bias current being at the maximum value.

In a second implementation form of the crystal oscillator system, according to the second aspect as such or any preceding implementation form of the second aspect, the bias control circuit implements a digital calibration loop that works with an analog automatic level control loop implemented by the bias amplifier to optimize oscillation amplitude.

In a third implementation form of the crystal oscillator system, according to the second aspect as such or any preceding implementation form of the second aspect, the crystal oscillator amplifier is configured to generate a negative resistance to compensate for losses in the crystal.

In a fourth implementation form of the crystal oscillator system, according to the second aspect as such or any preceding implementation form of the second aspect, the programmable reference swing voltage is configurable to different values based on application requirements.

In a fifth implementation form of the crystal oscillator system, according to the second aspect as such or any preceding implementation form of the second aspect, the number of cycles counted by the clock cycle counter is variable based on a current value of the bias current code.

In a sixth implementation form of the crystal oscillator system, according to the second aspect as such or any preceding implementation form of the second aspect, the bias control circuit is configured to perform calibration at each startup of the crystal oscillator system.

A third aspect relates to a method for controlling a crystal oscillator, the method comprising initiating a digital calibration process at startup of the crystal oscillator by setting a bias current code to a maximum value; counting a number of oscillation cycles of the crystal oscillator; comparing, after the number of oscillation cycles, a measured oscillation swing to a reference swing; decreasing the bias current code in response to the measured oscillation swing being greater than the reference swing; increasing the bias current code in response to the measured oscillation swing being less than the reference swing, wherein, in response to the bias current code being at the maximum value and the measured oscillation swing being less than the reference swing, the bias current code is set to the maximum value; and exiting the digital calibration process in response to the measured oscillation swing being less than the reference swing or the bias current code equals a minimum value.

In a first implementation form of the method, according to the third aspect as such, the method further comprising resetting a cycle counter and counting another number of oscillation cycles after decreasing the bias current code; and repeating the comparing, decreasing, and resetting steps until either the measured oscillation swing is less than the reference swing or the bias current code equals the minimum value.

In a second implementation form of the method, according to the third aspect as such or any preceding implementation form of the third aspect, the number of oscillation cycles is programmable.

In a third implementation form of the method, according to the third aspect as such or any preceding implementation form of the third aspect, the number of oscillation cycles varies based on a current value of the bias current code.

In a fourth implementation form of the method, according to the third aspect as such or any preceding implementation form of the third aspect, the reference swing is programmable based on application requirements.

In a fifth implementation form of the method, according to the third aspect as such or any preceding implementation form of the third aspect, the bias current code controls a bias current provided to a crystal oscillator amplifier, and wherein the bias current determines a negative resistance generated by the crystal oscillator amplifier to compensate for losses in a crystal.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A crystal oscillator control circuit comprising:

a clock cycle counter configured to count oscillation cycles at an output of a crystal oscillator circuit and generate a trigger signal after a number of cycles;

a clock comparator coupled to receive a peak envelope signal from the crystal oscillator circuit and a programmable reference swing voltage, wherein the clock comparator is configured to compare the peak envelope signal to the programmable reference swing voltage in response to the trigger signal from the clock cycle counter; and a bias current modifier circuit coupled to receive an output from the clock comparator and a first bias current code, wherein the bias current modifier circuit, at each startup of the crystal oscillator circuit, is configured to:

set a second bias current code to a maximum bias current code in response to the peak envelope signal being less than the programmable reference swing voltage and the first bias current code being at the maximum bias current code, generate the second bias current code by decreasing the first bias current code in response to the peak envelope signal being greater than the programmable reference swing voltage, generate the second bias current code by increasing the first bias current code by one binary step in response to the peak envelope signal being less than the programmable reference swing voltage, and set the second bias current code to a minimum bias current code in response to the first bias current code being at the minimum bias current code.

2. The crystal oscillator control circuit of claim 1, wherein the number of cycles counted by the clock cycle counter is programmable.

3. The crystal oscillator control circuit of claim 2, wherein the number of cycles is variable based on a current value of the first bias current code.

4. The crystal oscillator control circuit of claim 1, wherein the programmable reference swing voltage is configurable by a user.

5. The crystal oscillator control circuit of claim 1, wherein the bias current modifier circuit is configured to set the first bias current code to a maximum value at each startup of the crystal oscillator circuit.

6. The crystal oscillator control circuit of claim 1, wherein the bias current modifier circuit is configured to iteratively decrease the first bias current code until the peak envelope signal is less than the programmable reference swing voltage or the first bias current code equals one.

7. The crystal oscillator control circuit of claim 1, wherein the second bias current code is provided to an amplifier in the crystal oscillator circuit to control a bias current for a crystal oscillator amplifier.

8. A crystal oscillator system comprising:

a crystal oscillator circuit including:

a buffer and filter circuit configured to provide a filtered reference signal, a peak detector circuit configured to generate a peak envelope signal, a bias amplifier coupled to generate a bias current based on a bias current code, the filtered reference signal, and the peak envelope signal, a crystal oscillator amplifier configured to generate oscillations for a crystal based on the bias current generated by the bias amplifier, and a Schmitt trigger circuit coupled to the crystal oscillator amplifier and configured to generate clock signals; and a bias control circuit coupled to the crystal oscillator circuit, the bias control circuit including:

a clock cycle counter configured to count a number of cycles of the clock signals and generate a trigger signal, a clock comparator configured to compare the peak envelope signal to a programmable reference swing voltage in response to the trigger signal, and a bias current modifier circuit configured to generate an optimized bias current code based on an output of the clock comparator.

9. The crystal oscillator system of claim 8, wherein the bias current modifier circuit is configured to:

set the bias current code to a maximum value at startup;

decrease the bias current code in response to the peak envelope signal being greater than the programmable reference swing voltage; and increase the bias current code in response to the peak envelope signal being less than the programmable reference swing voltage, wherein the bias current code remains at the maximum value in response to the peak envelope signal being less than the programmable reference swing voltage and the bias current being at the maximum value.

10. The crystal oscillator system of claim 8, wherein the bias control circuit implements a digital calibration loop that works with an analog automatic level control loop implemented by the bias amplifier to optimize oscillation amplitude.

11. The crystal oscillator system of claim 8, wherein the crystal oscillator amplifier is configured to generate a negative resistance to compensate for losses in the crystal.

12. The crystal oscillator system of claim 8, wherein the programmable reference swing voltage is configurable to different values based on application requirements.

13. The crystal oscillator system of claim 8, wherein the number of cycles counted by the clock cycle counter is variable based on a current value of the bias current code.

14. The crystal oscillator system of claim 8, wherein the bias control circuit is configured to perform calibration at each startup of the crystal oscillator system.

15. A method for controlling a crystal oscillator, the method comprising:

initiating a digital calibration process at startup of the crystal oscillator by setting a bias current code to a maximum value;

counting a number of oscillation cycles of the crystal oscillator;

comparing, after the number of oscillation cycles, a measured oscillation swing to a reference swing;

decreasing the bias current code in response to the measured oscillation swing being greater than the reference swing;

increasing the bias current code in response to the measured oscillation swing being less than the reference swing, wherein, in response to the bias current code being at the maximum value and the measured oscillation swing being less than the reference swing, the bias current code is set to the maximum value; and exiting the digital calibration process in response to the measured oscillation swing being less than the reference swing or the bias current code equals a minimum value.

16. The method of claim 15, further comprising:

resetting a cycle counter and counting another number of oscillation cycles after decreasing the bias current code; and repeating the comparing, decreasing, and resetting steps until either the measured oscillation swing is less than the reference swing or the bias current code equals the minimum value.

17. The method of claim 15, wherein the number of oscillation cycles is programmable.

18. The method of claim 15, wherein the number of oscillation cycles varies based on a current value of the bias current code.

19. The method of claim 15, wherein the reference swing is programmable based on application requirements.

20. The method of claim 15, wherein the bias current code controls a bias current provided to a crystal oscillator amplifier, and wherein the bias current determines a negative resistance generated by the crystal oscillator amplifier to compensate for losses in a crystal.

* * * * *